United States Patent [19]

Sugibayashi

[11] Patent Number: 5,272,673
[45] Date of Patent: Dec. 21, 1993

[54] DYNAMIC RANDOM ACCESS MEMORY DEVICE WITH BUILD-IN TEST MODE DISCRIMINATOR FOR INTERRUPTING ELECTRIC POWER TO ROW ADDRESS DECODER AND DRIVER FOR TRANSFER GATES

[75] Inventor: Tadahiko Sugibayashi, Tokyo, Japan

[73] Assignee: NEC Corporation, Tokyo, Japan

[21] Appl. No.: 824,206

[22] Filed: Jan. 22, 1992

[30] Foreign Application Priority Data

Jan. 29, 1991 [JP] Japan .................................. 3-28078

[51] Int. Cl.$^5$ ............................................. G11C 29/00
[52] U.S. Cl. ........................... 365/201; 365/189.09; 365/230.06; 371/21.1
[58] Field of Search ............. 365/201, 189.09, 189.11, 365/230.06, 193; 371/15.1, 21.1, 22.5, 66, 21.4

[56] References Cited

U.S. PATENT DOCUMENTS

| | | | |
|---|---|---|---|
| 4,742,490 | 5/1988 | Hoffmann | 365/201 |
| 5,023,840 | 6/1991 | Tobita | 365/201 |
| 5,117,393 | 5/1992 | Miyazawa et al. | 365/201 |
| 5,119,337 | 6/1992 | Shimizu et al. | 365/201 |

FOREIGN PATENT DOCUMENTS

0266696  11/1988  Japan .................................. 365/201

Primary Examiner—Eugene R. LaRoche
Assistant Examiner—Son Dinh
Attorney, Agent, or Firm—Sughrue, Mion, Zinn, Macpeak & Seas

[57] ABSTRACT

A dynamic random access memory device can enter a diagnostic mode of operation to see whether or not undesirable short-circuit takes place in a word line and-/or a control signal line for transfer gates between bit lines and a sense amplifier unit, and a built-in testing operation discriminating unit discriminates the testing operation on the word lines and the control signal lines from other testing operations for causing a power supply system to interrupt electric power to a row address decoder unit and a driver unit for the control signal lines so that voltage level on a word line and/or a control signal line is rapidly decayed due to the short-circuit, thereby screening out the defective products before the delivery from the manufacturer.

3 Claims, 6 Drawing Sheets

DYNAMIC RANDOM ACCESS MEMORY DEVICE WITH BUILD-IN TEST MODE DISCRIMINATOR FOR INTERRUPTING ELECTRIC POWER TO ROW ADDRESS DECODER AND DRIVER FOR TRANSFER GATES

FIELD OF THE INVENTION

This invention relates to a dynamic random access memory device and, more particularly, to a built-in test mode discriminator for perfectly discovering a defective word line and a defective control signal line for transfer gate arrays.

DESCRIPTION OF THE RELATED ART

A dynamic random access memory device internally produces various voltage levels, and selectively distributes them to units and circuits incorporated therein. A typical example of the electric power system incorporated in the dynamic random access memory device is illustrated in FIG. 1. The electric power system is largely broken down into three sub-systems. The first subsystem has a bias circuit 1, and is used for reversely biasing the semiconductor substrate, because the component transistors are electrically isolated from the semiconductor substrate by means of the p-n junctions reversely biased. The second sub-system is associated with a row address decoder unit 2 provided for word lines WL1, WL2 and WLm, and comprises a power circuit 3 for boosting a selected word line over a power voltage level, and a make-up circuit 4 for maintaining the boosted voltage level on the selected word line. The third sub-system is provided in association with a driver unit 5 for transfer gate arrays described hereinlater, and comprises a power circuit 6 for also boosting control lines TG0, TG1, TGi and TGj over the power voltage level, and a make-up circuit 7 for maintaining the boosted voltage level on the control lines.

FIG. 2 shows a typical example of a memory cell array incorporated in the dynamic random access memory device, and comprises a memory cell array 8 implemented by memory cells M11, M1m, M21 Mm2 and Mmn arranged in rows and columns. Although only five memory cells are shown in the memory cell array 8, the plurality of memory cells M11 to Mmn are regularly located in the matrix. Each of the memory cells M11 to Mmn is of the one-transistor and one-capacitor type, and is implemented by a series combination of an n-channel enhancement type transfer transistor TR1 and a storage capacitor CP1. The word lines WL1, WL2 and WLm are respectively associated with the rows of the matrix, respectively, and are coupled with the gate electrodes of the n-channel enhancement type transfer transistors TR1 of the associated rows. Bit lines BL1, BL2, BL3, BL4, BLm and BLn are further provided for the memory cell array 8, and are coupled with the drain nodes of the n-channel enhancement type transfer transistors TR1 of the respective columns. A transfer gate array 9 is coupled between the bit lines BL1 to BLn and sense amplifier circuits SA1, SA2 and SAk, and comprises n-channel enhancement type transfer transistors TR11, TR12, TR13, TR14, TRm and TRn respectively coupled with the bit lines BL1 to BLn, and each of the sense amplifier circuits SA1 to SAk is associated with every two n-channel enhancement type transfer transistors TR11/TR12, TR13/TR14 or TRm/TRn and, accordingly, every two bit lines BL1/ BL2, BL3/BL4 or BLm/BLn.

In the dynamic random access memory device thus arranged, data bits are respectively stored in the storage capacitors CP1 in the form of electric charges, and the word lines WL1 to WLm are selectively boosted over the power voltage level so that the storage capacitors CP1 drive the associated bit lines without any substantial influence of the threshold level of the n-channel enhancement type transfer transistors TR1. Since each of the memory cells coupled with the selected word line is coupled with every other bit line, and differential voltage levels take place on the bit line pairs BL1/BL2, BL3/BL4 or BLm/BLn. The transfer gate array 9 relays the differential voltage levels on the associated bit line pairs BL1/BL2, BL3/BL4 or BLm/BLn to the sense amplifier circuits SA1 to SAk without any substantial voltage drop, because the control line TG0 is boosted over the power voltage level as described hereinbefore. Before activation of the sense amplifier circuits SA1 to SAk, the control line TG0 is recovered to the ground voltage level, and the sense amplifier circuits SA1 to SAk are electrically isolated from parasitic capacitances respectively coupled with the bit line pairs BL1/BL2 to BLm/BLn. Then, the sense amplifier circuits SA1 to SAk rapidly develop the differential voltage levels, and allows an output circuit (not shown) to discriminate the logic level of one of the data bits to be accessed. Thus, it is important for the dynamic random access memory device to boost the selected word line and the control line TG0 of the transfer gate array 9, and the dynamic random access memory device requires the various internal voltage levels.

For properly biasing the semiconductor substrate, the bias circuit 1 is incorporated in the first bus-system as described hereinbefore, and a typical example of the bias circuit is shown in FIG. 3. The bias circuit comprises an oscillator 1a implemented by a feed-back loop of inverting circuits 1b, 1c and 1d, and the oscillator 1a supplies a pulse train to an inverting circuit 1e as well as to an inverting circuit 1f. The inverting circuit 1e produces a complementary pulse train BTUP, and supplies it to the make-up circuits 4 and 7 as will be described hereinlater. The inverting circuit 1f also produces a complementary pulse train, and is coupled with a capacitor 1g. The capacitor 1g is further coupled with the common drain node N1 of a series combination of two n-channel enhancement type field effect transistors 1h and 1i coupled between the semiconductor substrate and a ground voltage line GND, and is driven by the inverting circuit 1f. The gate electrode of the n-channel enhancement type field effect transistor 1h is coupled with the semiconductor substrate, and the gate electrode of the n-channel enhancement type field effect transistor 1i is coupled with the common drain node N1. If the oscillator 1a starts on producing the pulse train, the inverting circuit 1f capacitively coupled with the series combination drives the n-channel enhancement type field effect transistors 1h and 1i. While the voltage level at the common drain node N1 is higher than the ground voltage level, the positive voltage level is discharged to the ground voltage line GND, and the n-channel enhancement type field effect transistor 1h blocks the semiconductor substrate from the positive voltage level. If leakage current passing through the p-n junctions lift the semiconductor substrate to a positive voltage level, the n-channel enhancement type field effect transistor 1h draws the positive voltage level from the semiconductor substrate while the common drain node N1 is shifted to a negative voltage level.

Each of the make-up circuits 4 and 7 is illustrated in FIG. 4, and comprises an inverting circuit 4a supplied with the complementary pulse train BTUP, a bootstrapping circuit 4b responsive to the pulse train retrieved from the complementary pulse train BTUP for boosting a make-up line RAV, and a clamping circuit 4c coupled with the make-up line RAV for preventing the make-up line from excess charge. The bootstrapping circuit 4b comprises a boost-up capacitor 4d and two n-channel enhancement type field effect transistors 4e and 4f arranged in diode configuration. While the pulse train is recovered to the ground voltage level, the n-channel enhancement type field effect transistor 4e supplies a positive power voltage level Vdd to the common drain node N2, and the inverting circuit 4a boosts up the common drain node N2 over the power voltage level Vdd with the pulse train lifted up. The boosted voltage level passes through the n-channel enhancement type field effect transistor 4f, and the make-up line RAV propagates the boosted voltage level through the row address decoder unit 2 to the selected word line. The clamping circuit 4c is implemented by a series combination of n-channel enhancement type field effect transistors 4g and 4h coupled between the make-up line RAV and a reference voltage source Vref, and prevents the make-up line and, accordingly, the selected word line from excessive elevation. The make-up circuit 7 is similar in circuit arrangement as well as in behavior, and no further description is incorporated hereinbelow.

The dynamic random access memory device thus arranged is usually subjected to a diagnosis prior to delivery from the manufacturer, and various testing operations are carried out on the component units and circuits. The testing operations are different in time period depending upon the purpose thereof. The word lines WL1 to WLm provide the gate electrodes of the n-channel enhancement type transfer transistors TR1 of the associated memory cells M11 to Mmn, and extend over thin gate oxide films of the n-channel enhancement type transfer transistors TR1. If the gate oxide films has undesirable pin holes, the associated word line hardly keeps the voltage level high. Moreover, the word lines WL1 to WLm crosses various conductive lines such as the bit lines BL1 to BLn. Even though a inter-level insulating film are provided therebetween, some word lines are unfortunately short-circuited to those conductive lines. In this situation, the word line is hardly kept high. Similar undesirable situation takes place in the control lines TG0 to TGj. In order to enhance the reliability of the products, dynamic random access memory devices with such a defective word line and/or a defective control line should be discarded before the delivery, and, for this reason, a testing operation is scheduled for the word lines WL1 to WLm and the control lines TG0 to TGj. If the dynamic random access memory device is of 16 megabit type, the word lines WL1 to WLm and the control lines TG0 to TGj are examined in a 16-bit parallel test mode of operation, and the word lines WL1 to WLm as well as the control lines TG0 to TGj are sequentially elevated to the boosted voltage level to see whether or not test data bits are perfectly written into and read out from the memory cells M11 to Mmn. In order to see whether or not the word lines WL1 to WLm and the control lines TG0 to TGj are excellent, each of the word lines WL1 to W1m and each of the control lines TG0 to TGj are maintained in the boosted voltage level for the maximum cycle time.

However, a problem is encountered in the prior art dynamic random access memory device in that the cost for the diagnosis is increased due to the testing operation on the word lines WL1 to WLm and the control lines TG0 to TGj. This is because of the fact that each word line and each control line are kept in the boosted voltage level for the maximum cycle time.

Another problem is that the some products become defective after the delivery. If a word line and/or a control line is barely isolated from a conductive line or a substrate, the amount of leakage current is extremely small. If the leakage current is less than the make-up current from the make-up circuit 4 or 7, and the testing operation hardly screens out the defective products.

SUMMARY OF THE INVENTION

It is therefore an important object of the present invention to provide a dynamic random access memory device which is low in cost for diagnosis and has high reliability.

To accomplish the object, the present invention proposes to interrupt the function of a power system.

In accordance with the present invention, there is provided a dynamic random access memory device fabricated on a semiconductor chip and selectively entering a standard mode and a diagnostic mode of operation, comprising: a) a plurality of memory cells arranged in rows and columns, and respectively storing data bits in the form of electric charges; b) a plurality of bit line pairs associated with the columns of the plurality of memory cells; c) a plurality of word lines respectively associated with the rows of the plurality of memory cells, and selectively driven to an active level for allowing data bits to be read out to the plurality of bit line pairs in the form of differential voltage; d) a sense amplifier unit operative to develop differential voltage levels indicative of the data bits; e) a plurality of transfer gates coupled between the plurality of bit lines and the sense amplifier unit, and responsive to a control signal of an active level on a control signal line for transferring the differential voltages to the sense amplifier unit; f) a row address decoder unit operative to designate one of the plurality of word lines; g) a driver unit for supplying the control signal of the active level to the plurality of transfer gates; h) a power supply system operative to supply electric power so that the row address decoder unit and the driver unit elevate the one of the word lines and the control signal to the active levels, respectively; and i) a test operation discriminating unit discriminating a first testing operation on the plurality of word lines and the control signal line from other testing operation in the diagnostic mode, and operative to cause the power supply system to interrupt the electric power supplied to the row address decoder unit and the driver unit.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 5:
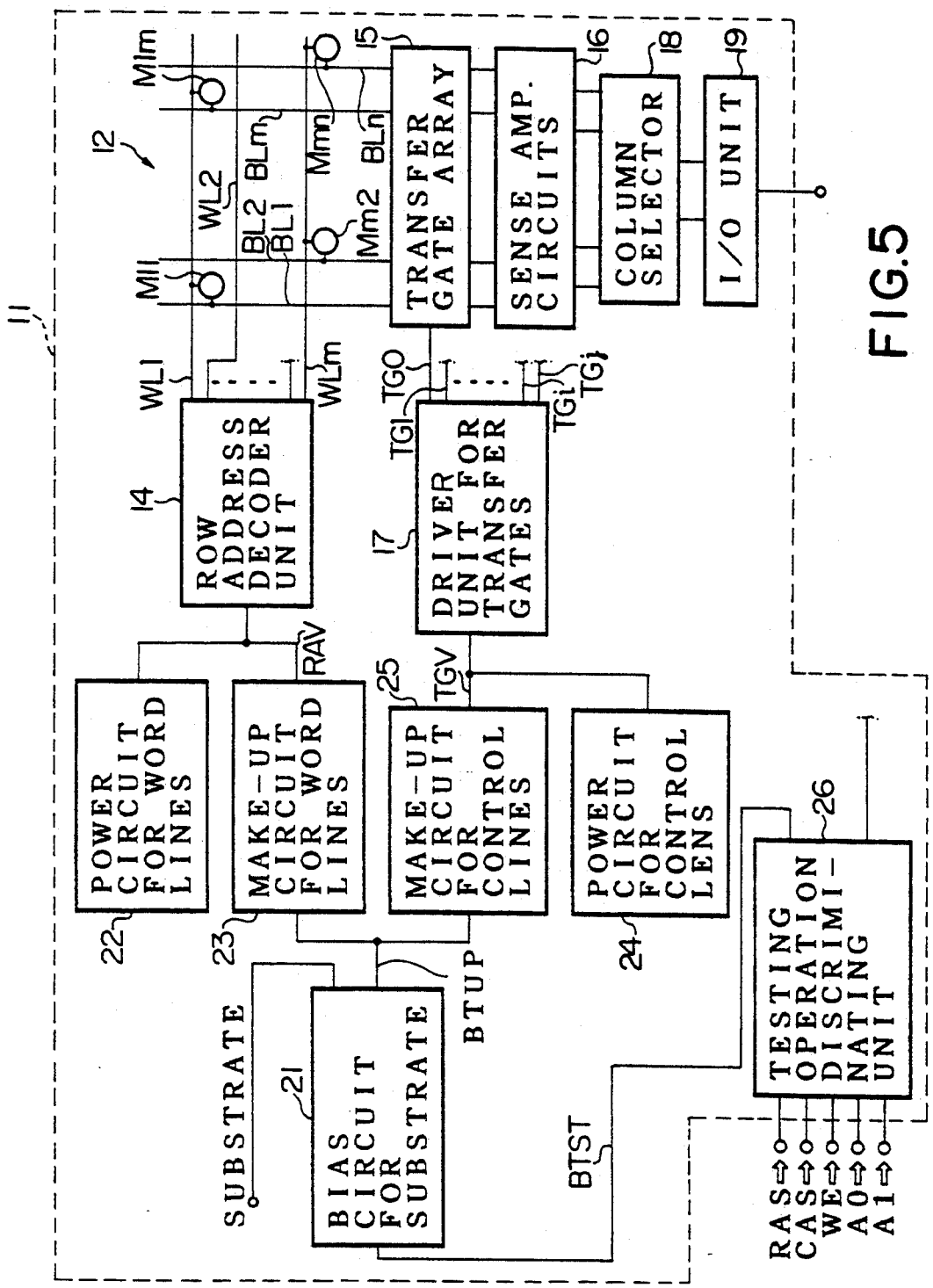
FIG. 5 is a block diagram showing the arrangement of a dynamic random access memory device according to the present invention.

Referring to FIG. 5 of the drawings, a dynamic random access memory device embodying the present invention is fabricated on a single semiconductor chip 11, and is of 16 megabit type. The dynamic random access memory device comprises a plurality of memory cell arrays, however only one of the memory cell arrays is shown and designated by reference numeral 12. The memory cell array 12 is implemented by a plurality of memory cells M11, M1m, Mm2 and Mmn arranged in rows and columns. Each of the memory cells M11 to Mmn is of the one-transistor and one-capacitor type, and is implemented by a series combination of an n-channel enhancement type transfer transistor and a storage capacitor as similar to the memory cell incorporated in the prior art dynamic random access memory device. Therefore, data bits are stored in the storage capacitors in the form of electric charges.

The word lines WL1, WL2 and WLm are respectively associated with the rows of the memory cell array 12, respectively, and are coupled with the gate electrodes of the n-channel enhancement type transfer transistors TR1 of the associated rows. Bit lines BL1, BL2, BLm and BLn are further provided for the memory cell array 12, and are coupled with the drain nodes of the n-channel enhancement type transfer transistors of the respective columns. Adjacent two bit lines BL1/BL2 or BLm/BLn are paired with each other, and every two bit lines BL1/BL2 or BLm/BLn form a bit line pair. The word lines WL1 to WLm are selectively driven by a row address decoder unit 14, and data bits are read out from the memory cells coupled with the selected word line to the associated bit lines. The data bits thus read out produce differential voltages on the associated bit line pairs, and the bit line pairs propagates the differential voltages. In this instance, the row address decoder unit 14 allows the selected word line to exceed a positive power voltage level Vdd, and, accordingly, the active level on the selected word line is higher than the positive power voltage level Vdd.

A transfer gate array 15 is coupled between the bit lines BL1 to BLn and sense amplifier circuits 16, and comprises n-channel enhancement type transfer transistors respectively coupled with the bit lines BL1 to BLn as similar to the prior art transfer gate array 9. The transfer gate array 15 is responsive to a control signal on a control signal line TG0 of an active level, and transfers the differential voltages to the sense amplifier circuits 16. The control signal line TG0 is driven by a driver circuit 17, and the active level is higher than the positive power voltage level Vdd. Each of the sense amplifier circuits 16 is associated with every two n-channel enhancement type transfer transistors and, accordingly, one of the bit line pairs, and develops the differential voltages on the associated bit line pair.

A column selector unit 18 is coupled with the sense amplifier circuits 16, and selectively transfers the differential voltages developed by the sense amplifier circuits 16 to an input-and-output unit 19 under the control of a column address decoder unit (not shown).

The dynamic random access memory device thus arranged selectively enters a standard mode of operation and a diagnostic mode of operation. In the standard mode of operation, the dynamic random access memory device provides a data storage for an electronic system. However, the functions of the component units and circuits are examined in the diagnostic mode of operation carried out before delivery from the manufacturer. Since, data bits are respectively stored in the storage in the form of electric charges, and the word lines WL1 to WLm are selectively boosted over the positive power voltage level Vdd so that the storage capacitors drive the associated bit lines without any substantial influence of the threshold level of the n-channel enhancement type transfer transistors. Since each of the memory cells of the selected word line is coupled with every other bit line, and differential voltage levels take place on the bit line pairs BL1/BL2 or BLm/BLn. The transfer gate array 15 relays the differential voltage levels on the associated bit line pairs BL1/BL2 or BLm/BLn to the sense amplifier circuits 16 without any substantial voltage drop, because the control line TG0 is boosted over the positive power voltage level Vdd as described hereinbefore. Before activation of the sense amplifier circuits 16, the control line TG0 is recovered to the ground voltage level, and the sense amplifier circuits 16 are electrically isolated from parasitic capacitances respectively coupled with the bit line pairs BL1/BL2 to BLm/BLn. Then, the sense amplifier circuits 16 rapidly develop the differential voltage levels, and allows the output unit 19 to discriminate the logic level of one of the data bits to be accessed.

The electric power system incorporated in the dynamic random acess memory device implementing the first embodiment is also broken down into three sub-systems. The first sub-system has a bias circuit 21, and is used for reversely biasing the semiconductor substrate, because the component transistors such as n-channel enhancement type transfer transistors are electrically isolated from the semiconductor substrate 11 by means of the p-n junctions reversely biased. The second sub-system is associated with a row address decoder unit 14, and comprises a power circuit 22 for boosting a selected word line over the positive power voltage level Vdd, and a make-up circuit 23 for maintaining the boosted voltage level on the selected word line. The third sub-system is provided in association with the driver unit 17 for transfer gate arrays one of which is described hereinbefore. The third sub-system comprises a power circuit 24 for also boosting control lines TG0, TG1 TGi and TGj over the positive power voltage level Vdd, and a make-up circuit 25 for maintaining the boosted voltage level on the control lines.

Figure 1:
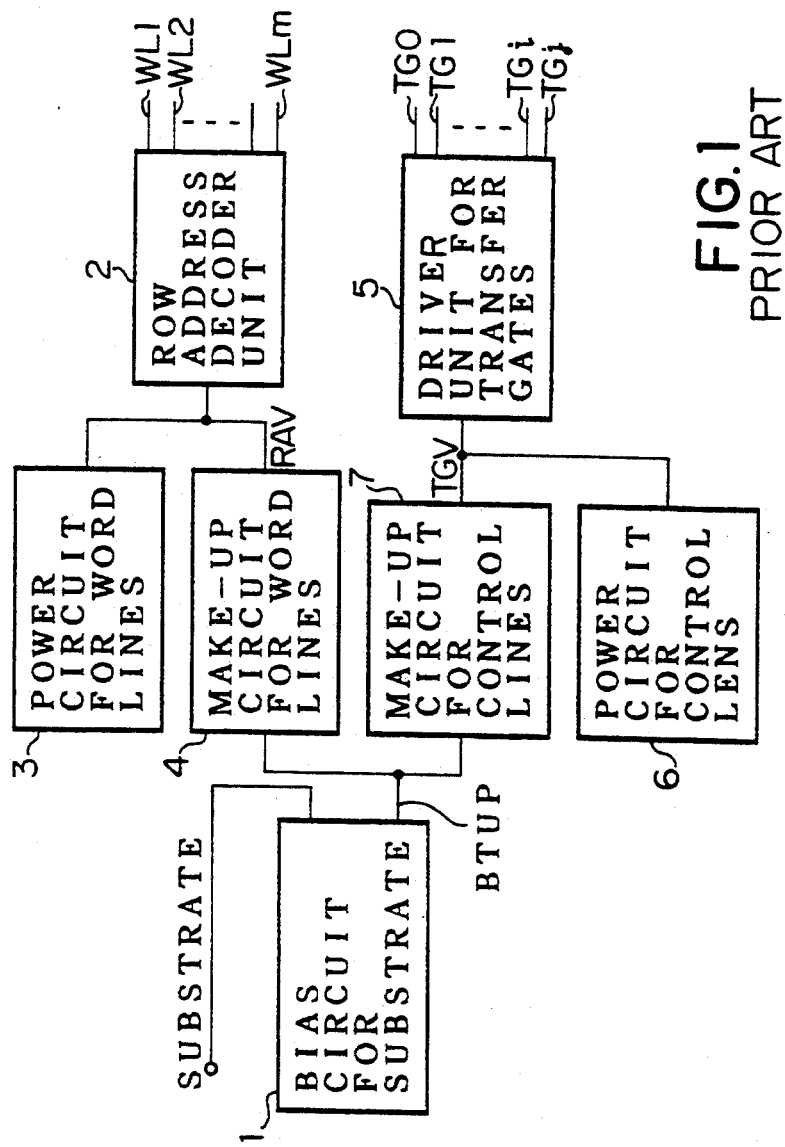
FIG. 1 is a block diagram showing the arrangement of the power system incorporated in the prior art dynamic random access memory device.
Figure 2:
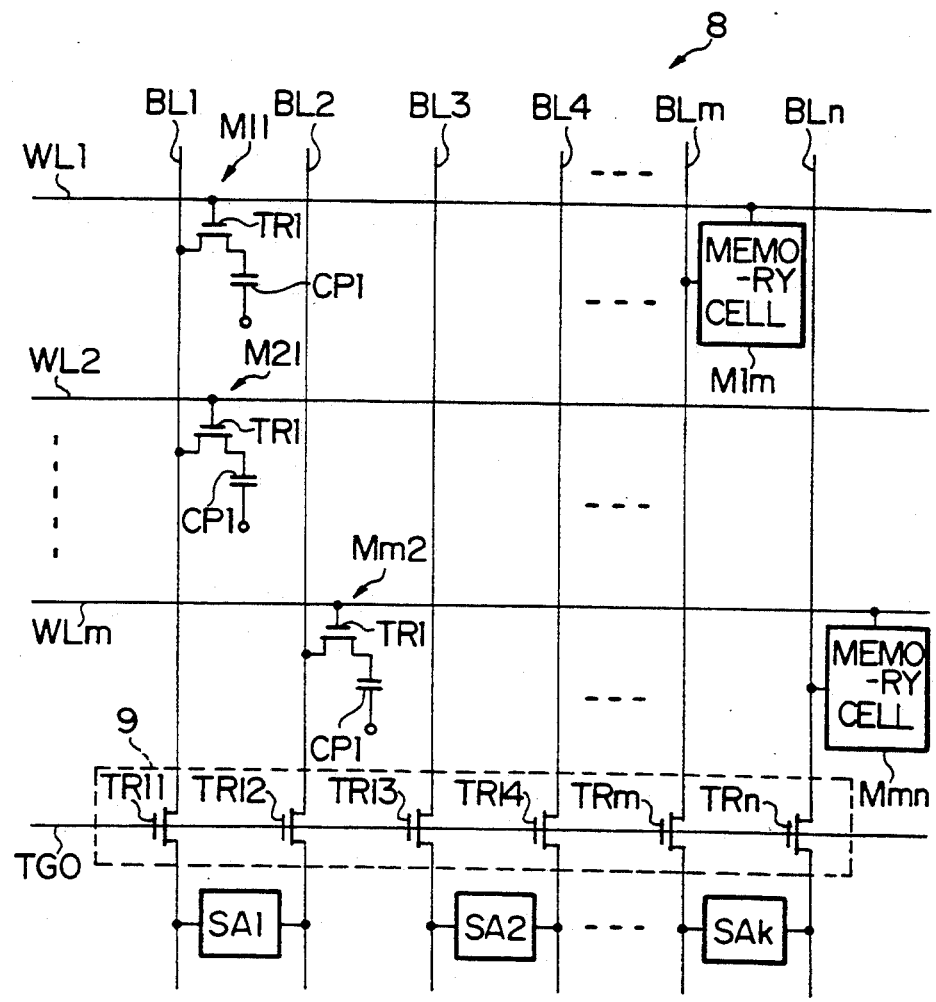
FIG. 2 is a circuit diagram showing the arrangement of the memory cell array incorporated in the prior art dynamic random access memory device.
Figure 3:
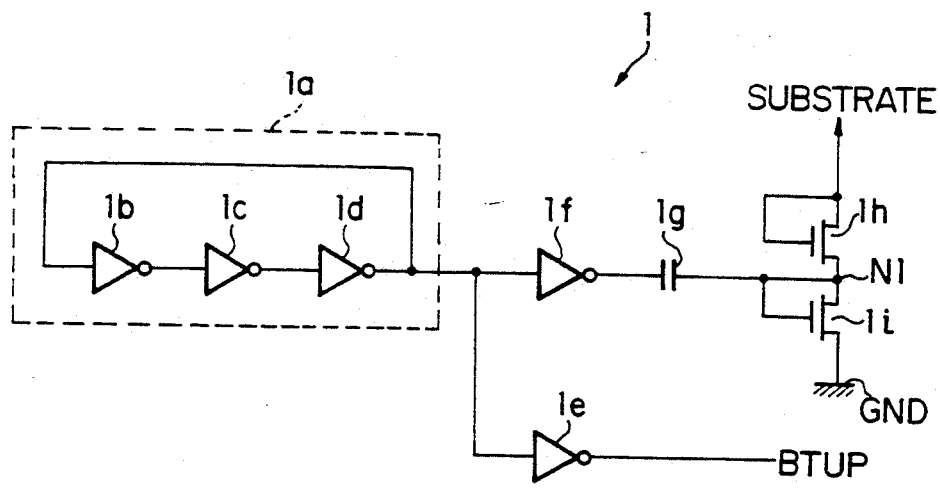
FIG. 3 is a circuit diagram showing the arrangement of the bias circuit for the substrate incorporated in the prior art dynamic random acess memory device.
Figure 4:
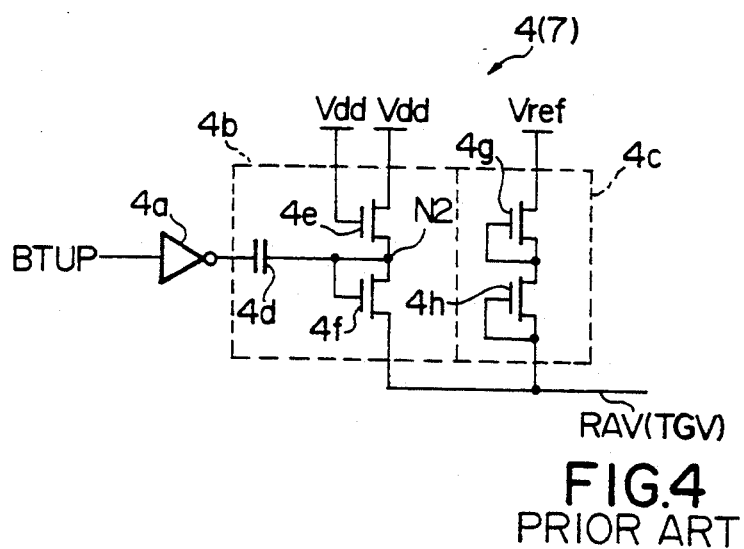
FIG. 4 is a circuit diagram showing the arrangement of the make-up circuit for the word lines incorporated in the prior art dynamic random access memory device.
Figure 6:
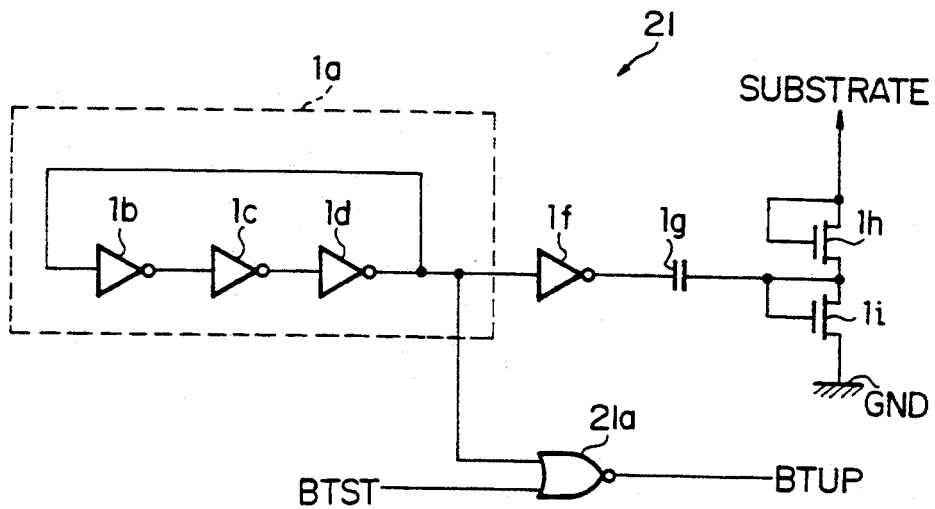
FIG. 6 is a circuit diagram showing a bias circuit incorporated in the dynamic random access memory device shown in FIG. 5.

Turning to FIG. 6 of the drawings, the circuit arrangement of the bias circuit 21 is illustrated in detail. The bias circuit 21 is similar to the bias circuit 1 except for the inverting circuit 1e replaced with a NOR gate 21a, and, for this reason, the other components are labeled with the same references used in FIG. 3 without any detailed description for the sake of simplicity. Therefore, the oscillator 1a, the inverter 1f, the capacitor 1g, the NOR gate 21a and the series combination of n-channel enhancement type field effect transistors 1h and 1i form the bias circuit 21.

Turning back to FIG. 5, the dynamic random access memory device implementing the first embodiment further comprises a testing operation discriminating unit 26, and a row address strobe signal RAS of an active low level, a column address strobe signal CAS of the active low level, a write enable signal WE of the active low level and two address bits A0 and A1 are supplied to the testing operation discriminating unit 26. In this instance, if the write enable signal WE goes down to the active low level prior to a CAS-before-RAS refreshing cycle, the dynamic random access memory device enters the diagnostic mode. In the diagnostic mode of operation, the 16-bit parallel testing operation is established with the address bits A0 and A1 in either high or low level, and the testing operation discriminating unit 26 produces a control signal BTST of logic "0" level. With the control signal BTST of logic "0" level, the NOR gate 21a serves as an inverting circuit, and the bias circuit 21 behaves as similar to the prior art bias circuit 1. However, if the address bits A0 and A1 are different in logic level in the diagnostic mode, the dynamic random access memory device enters a first testing operation on the word lines WL1 to W1m and the control lines TG0 to TGj, and the testing operation discriminating unit 26 changes the control signal BTST from logic "0" level to logic "1" level. With the control signal BTST of logic "1" level, the NOR gate 21a fixes the output signal BTUP to the low or ground voltage level, and any current is made up from the make-up circuits 23 and 25 to the selected word line and the control lines TG0 to TGj. In other words, the testing operation discriminating unit 26 interrupts the power supply to the selected word line and the control lines TG0 to TGj. In this situation, if there is a defective word line or a defective control line, a test bit pattern is not be properly read out, and the manufacturer can screen out the defective product. The circuit arrangement of the testing operation discriminating unit 26 is not shown and described in detail. However, the control signal BTST is merely produced through a logic operation on the row address strobe signal RAS, the column address strobe signal CAS, the write enable signal WE and the address bits A0 and A1, and, for this reason, various circuit arrangements would be designed by a person skilled in the art.

The interrupt of the power supply is effective against an extremely small amount of leakage current, because the selected word line and the control lines TG0 to TGj are gradually decayed. Therefore, even if the leakage current is less than the make-up current supplied from the make-up circuit 23 or 25, the defective word line and/or the defective control line is screened out, and the reliability of the products is improved. Moreover, after the interrupt of the power supply, the voltage level on the selected word line and the voltage levels on the control lines TG0 to TGj rapidly go down, and the first testing operation consumes a relatively short time period. This results in reduction of the cost for the diagnosis.

Second Embodiment

Figure 7:
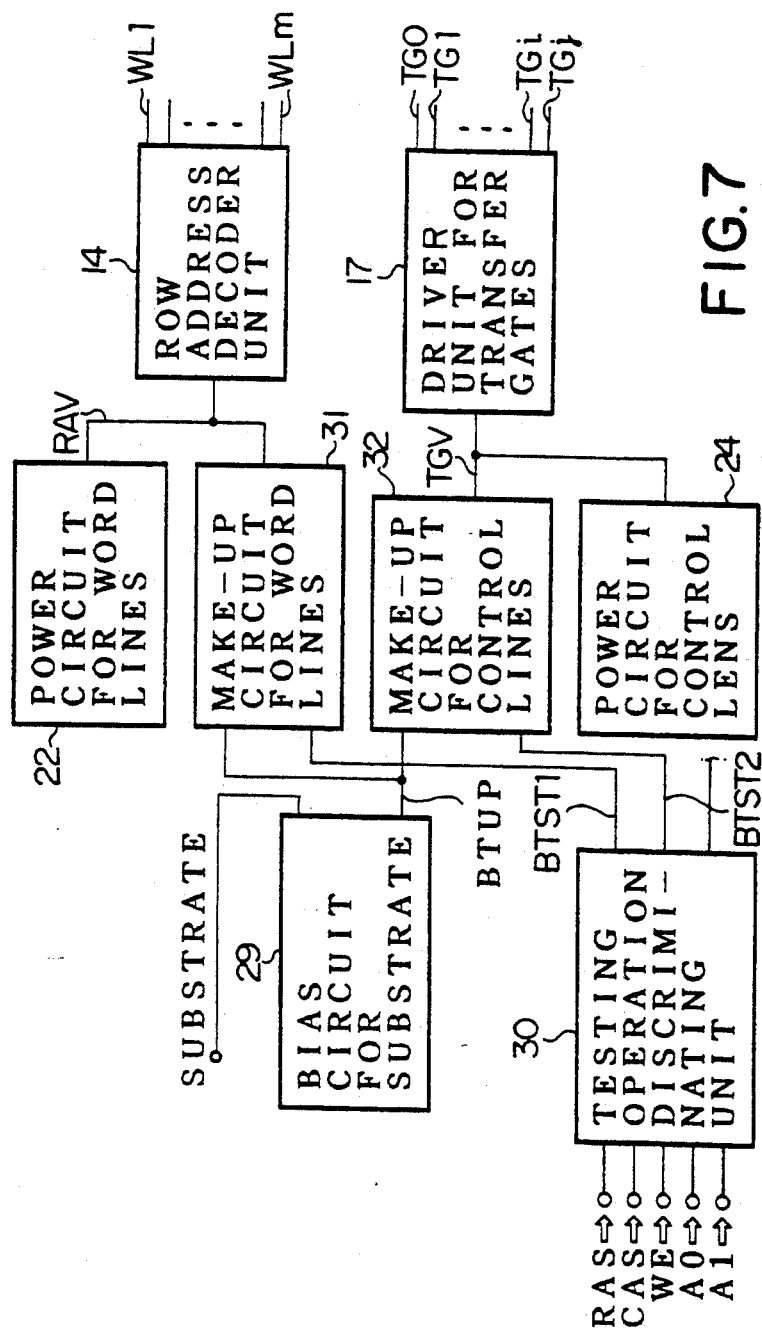
FIG. 7 is a block diagram showing the arrangement of an essential part of another dynamic random access memory device according to the present invention.

Turning to FIG. 7 of the drawings, a power supply system incorporated in another dynamic random access memory device is illustrated. The circuit arrangement of the power supply system is similar to that of the first embodiment except for a bias circuit 29, a testing operation discriminating unit 30, and make-up circuits 31 and 32, and, for this reason, the other component units and circuits are labeled with the same references designating the corresponding units and circuits of the first embodiment without any detailed description.

The bias circuit 29 is similar in circuit arrangement to that of the prior art dynamic random access memory device, and no further description is hereinbelow incorporated. The testing operation discriminating unit 30 is similarly responsive to the row address strobe signal RAS, the column address strobe signal CAS, the write enable signal WE and the address bits A0 and A1. If both of the address bits A0 and A1 are either logic "1" or "0" level in the CAS-before-RAS refreshing cycle, the testing operation discriminating unit 30 allows the dynamic random access memory device in the 16-bit parallel testing operation. However, if the address bits A0 and A1 are different in logic level in the CAS-before-RAS refreshing cycle, the testing operation discriminating unit 30 produces one of the control signals BTST1 or BTST2 depending upon the combination of the address bits A0 and A1. The address bit A0 of logic "1" level and the address bit A1 of logic "0" level are, by way of example, indicative of the control signal BTST1, and the opposite results in the control signal BTST2.

Figure 8:
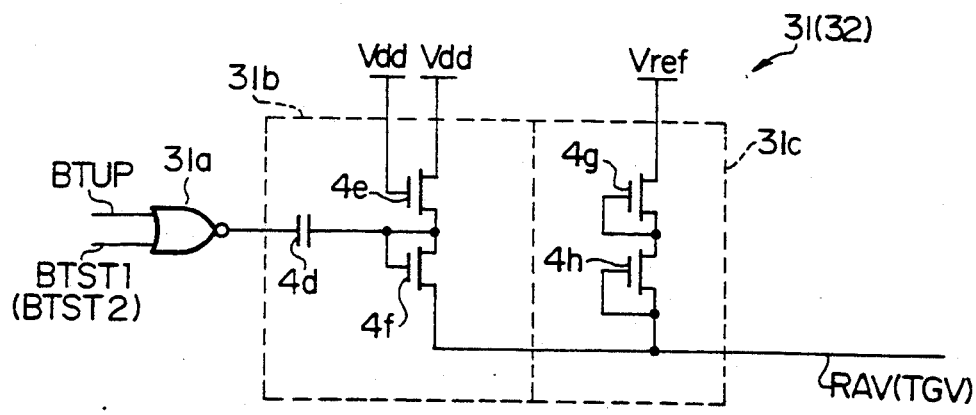
FIG. 8 is a circuit diagram showing the arrangement of a make-up circuit for word lines incorporated in the dynamic random access memory device shown in FIG. 7.

The circuit arrangement of each of the make-up circuits 31 and 32 is shown in FIG. 8, and each make-up circuit 31 or 32 largely comprises a NOR gate 31a, a bootstrapping circuit 31b and a clamping circuit 31c. The bootstrapping circuit 31a and the clamping circuit 31c are respectively similar in circuit arrangement to the bootstrapping circuit 4b and the clamping circuit 4c, and the same references are labeled with the corresponding transistors for the sake of simplicity. The NOR gate 31a has two input nodes one of which is supplied with the complementary pulse train BTUP and the other of which is supplied with the control signal BTST1 or BTST2 from the testing operation discriminating unit 26. Therefore, if the control signal BTST1 or BTST2 remains in logic "0" level, the make-up circuits 31 and 32 behaves as similar to those of the prior art dynamic random access memory device. However, if the testing operation discriminating unit 26 changes the control signal BTST1 or BTST2 from logic "0" to logic "1", the make-up circuits 31 and 32 are never responsive to the complementary pulse train BTUP, and interrupt the make-up current.

The power supply system forming a part of the second embodiment achieves the same advantages as the first embodiment, and an additional advantage is that the two control signals BTST1 and BTST2 allow the manufacturer to easily specify leakage point.

Although particular embodiments of the present invention have been shown and described, it will be obvious to those skilled in the art that various changes and modifications may be made without departing from the spirit and scope of the present invention.

What is claimed is:

1. A dynamic random access memory device fabricated on a semiconductor chip and selectively entering a standard mode and a diagnostic mode of operation, comprising:
   a) a plurality of memory cells arranged in rows and columns, and respectively storing data bits in the form of electric charges;
   b) a plurality of bit line pairs associated with the columns of said plurality of memory cells;
   c) a plurality of word lines respectively associated with said rows of said plurality of memory cells, and selectively driven to an active level for allowing data bits to be read out to said plurality of bit line pairs in the form of differential voltage;
   d) a sense amplifier unit operative to develop differential voltage levels indicative of said data bits;
   e) a plurality of transfer gates coupled between said plurality of bit lines and said sense amplifier unit, and responsive to a control signal of an active level on a control signal line for transferring said differential voltages to said sense amplifier unit;
   f) a row address decoder unit operative to designate one of said plurality of word lines;
   g) a driver unit for supplying said control signal of said active level to said plurality of transfer gates;
   h) a power supply system operative to supply electric power so that said row address decoder unit and said driver unit elevate said one of said word lines and said control signal line to said active levels, respectively; and
   i) a test operation discriminating unit discriminating a first testing operation on said plurality of word lines and said control signal line from other testing operation in said diagnostic mode, and operative to cause said power supply system to interrupt said electric power supplied to said row address decoder unit and said driver unit.

2. A dynamic random access memory device as set forth in claim 1, in which said power supply system comprises i-1) a bias circuit having an oscillator for producing a pulse train, and biasing means for maintaining said semiconductor substrate in a predetermined voltage level with said pulse train, i-2) a first power unit for allowing said row address decoder unit to boost up said one of said plurality of word lines over a power voltage level to said active level, i-3) a second power unit for allowing said driver unit to boost up said control signal line over said power voltage level to said active level, i-4) a first make-up circuit responsive to a complementary pulse train of said pulse train, and supplying first make-up current to said row address decoder unit for allowing said one of said plurality of word lines to remain in said active level, and i-5) a second make-up circuit responsive to said complementary pulse train, and supplying second make-up current to said driver unit for allowing said control signal line to remain in said active level, said test operation discriminating unit producing a test control signal on the basis of external signals for interrupting said oscillator in production of said pulse train.

3. A dynamic random access memory device as set forth in claim 1, in which said power supply system comprises i-1) a bias circuit having an oscillator for producing a pulse train, and biasing means for maintaining said semiconductor substrate in a predetermined voltage level with said pulse train, i-2) a first power unit for allowing said row address decoder unit to boost up said one of said plurality of word lines over a power voltage level to said active level, i-3) a second power unit for allowing said driver unit to boost up said control signal line over said power voltage level to said active level, i-4) a first make-up circuit responsive to a complementary pulse train of said pulse train in the presence of a first test control signal, and supplying first make-up current to said row address decoder unit for allowing said one of said plurality of word lines to remain in said active level, and i-5) a second make-up circuit responsive to said complementary pulse train in the presence of a second test control signal, and supplying second make-up current to said driver unit for allowing said control signal line to remain in said active level, said test operation discriminating unit selectively producing said first and second test control signals on the basis of external signals for selectively enabling said first and second make-up circuits.

* * * * *